(12) United States Patent
Kim et al.

(10) Patent No.: US 7,211,741 B2
(45) Date of Patent: May 1, 2007

(54) PLASMA DISPLAY DEVICE

(75) Inventors: Sok-San Kim, Suwon-si (KR);
Tae-Kyoung Kang, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/319,556

(22) Filed: Dec. 29, 2005

(65) Prior Publication Data

US 2006/0158837 A1    Jul. 20, 2006

(30) Foreign Application Priority Data

Jan. 20, 2005  (KR)  ............... 10-2005-0005303

(51) Int. Cl.
*H05K 9/00*  (2006.01)
(52) U.S. Cl. .............. 174/381; 174/377; 313/489; 361/681
(58) Field of Classification Search ........ 174/377, 174/381, 389; 313/489, 479; 361/681
See application file for complete search history.

(56) References Cited

U.S. PATENT DOCUMENTS

| | | | |
|---|---|---|---|
| 6,229,085 B1 * | 5/2001 | Gotoh et al. ............... | 174/353 |
| 6,686,536 B2 * | 2/2004 | Tone et al. ............... | 174/389 |
| 2002/0042162 A1 * | 4/2002 | Tone et al. ............... | 438/118 |
| 2004/0198096 A1 * | 10/2004 | Kim et al. ............... | 439/607 |
| 2005/0200264 A1 * | 9/2005 | Kawanami et al. ......... | 313/479 |
| 2005/0248274 A1 * | 11/2005 | Park .......................... | 313/582 |

* cited by examiner

*Primary Examiner*—Hung V. Ngo
(74) *Attorney, Agent, or Firm*—Lee & Morse, P.C.

(57) ABSTRACT

A plasma display device including a protective layer disposed adjacent to a front surface of a plasma display panel, a chassis base, wherein a front surface of the chassis base is disposed adjacent to a rear surface of the plasma display panel, circuit units disposed on a rear surface of the chassis base and a conductive member that electrically connects the protective layer to the chassis base, wherein the protective layer serves to filter electromagnetic radiation emitted from the plasma display panel.

20 Claims, 4 Drawing Sheets

PLASMA DISPLAY DEVICE

BACKGROUND OF THE INVENTION

1. Technical Field

The present invention relates to a plasma display device. More particularly, the present invention relates to a plasma display device including a plasma display panel capable of efficiently reducing or eliminating electromagnetic radiation emitted from a front surface of the plasma display panel.

2. Related Art

Generally, a plasma display device produces a desired image using plasma discharge. A plasma display device may include a plasma display panel, for displaying images using plasma discharge generated in discharge cells therein, a chassis base, for supporting the plasma display panel, and one or more circuit units, which drive the plasma display panel.

A plasma display device may also include a front case and a rear case, covering front and rear sides, respectively, of a plasma display module. The plasma display module may include the plasma display panel, a chassis base and the circuit units, which are assembled together to form the display module. In addition, a reinforced glass may be provided on the front case such that a user can see images output from the plasma display panel while the plasma display module is protected from any impacts thereto. The reinforced glass may be spaced apart from the plasma display panel by a predetermined gap.

A plasma display device having the above-mentioned structure may suffer from various deficiencies. For example, the plasma display device may expose a user to harmful electromagnetic radiation. In particular, since empty spaces may exist between the module and the cases, electromagnetic radiation discharged from the plasma display panel may be directly transmitted to the user through these spaces. Further, since the empty spaces may exist between the module and the cases, the plasma display device may have a larger size than is desirable. In addition, the reinforced glass may be expensive due to the need to ensure that it exhibits the desired optical and physical characteristics, thus necessitating an increased selling price of the plasma display device which, in turn, may depress unit sales. Finally, since the reinforced glass may be heavy, it may cause the weight of the plasma display device to increase.

SUMMARY OF THE INVENTION

The present invention is therefore directed to a plasma display device that substantially overcomes one or more of the problems due to the limitations and disadvantages of the related art.

It is therefore a feature of an embodiment of the present invention to provide a plasma display device capable of reducing or eliminating electromagnetic radiation emitted through a front surface of the device.

It is therefore another feature of an embodiment of the present invention to provide a plasma display device capable of reducing or eliminating electromagnetic radiation emitted through a front surface of the device while minimizing the volume and weight of the device.

At least one of the above and other features and advantages of the present invention may be realized by providing a plasma display device including a protective layer disposed adjacent to a front surface of a plasma display panel, a chassis base, wherein a front surface of the chassis base may be disposed adjacent to a rear surface of the plasma display panel, circuit units disposed on a rear surface of the chassis base, and a conductive member that electrically connects the protective layer to the chassis base, wherein the protective layer serves to filter electromagnetic radiation emitted from the plasma display panel.

The protective layer may be a filter film attached to the front surface of the plasma display panel. The protective layer may be disposed directly on the front surface of the plasma display panel. The protective layer may be a polymer containing a reinforcing material. The plasma display device may further include a first vibration absorber disposed between, and in contact with, a front surface of the protective layer and a rear surface of the conductive member, wherein the first vibration absorber is elastically deformable and conductive and electrically connects the protective layer to the conductive member. The plasma display device may further include a front case provided on the front of the plasma display panel, and a second vibration absorber disposed between, and in contact with, the front surface of the protective layer and a rear surface of the front case.

The chassis base may include an offset portion at a lower edge, and the conductive member may be assembled to the offset portion. The offset portion of the chassis base may include a first member extending rearward from a major surface of the chassis base and a second member extending downward from the first member, such that the second member is substantially parallel to the major surface of the chassis base, and a rear surface of the conductive member may be assembled to a front surface of the second member. The conductive member may include a main body that is assembled to the offset portion of the chassis base and a leg extending upward from the main body in front of a front surface of the protective layer.

The plasma display device may further include a first vibration absorber provided between the front surface of the protective layer and a rear surface of the leg of the conductive member, wherein the first vibration absorber is elastically deformable and conductive, and electrically connects the protective layer to the conductive member.

The plasma display device may further include a holder mounted on the rear surface of the chassis base. The plasma display device may further include a bracket member attached to the holder. The bracket member may be electrically connected to the chassis base by the holder. The bracket member may have an offset portion at a lower edge, and the conductive member may contact the offset portion. The offset portion of the bracket member may include a first member extending forward from a major surface of the bracket and a second member extending downward from the first member, such that the second member is substantially parallel to the major surface of the bracket, and a rear surface of the conductive member may be assembled to a front surface of the second member. The conductive member may include a main body that is assembled to the offset portion of the bracket member; and a leg extending upward from the main body in front of a front surface of the protective layer. The conductive member may include a main body and a leg extending upward from the main body, and the plasma display panel and the protective layer may be supported above the main body such that they do not rest directly on the main body.

A full weight of the plasma display panel may be supported by the conductive member. The full weight of the plasma display panel may be transferred directly to the chassis base, and the full weight of the plasma display panel and the chassis base may be transferred directly to the main body of the conductive member. The full weight of the plasma display panel may be transferred directly to the chassis base, the full weight of the plasma display panel and the chassis base may be transferred directly to a holder mounted on a rear surface of the chassis base, the full weight of the plasma display panel, the chassis base, and the holder may be transferred directly to a bracket, and the full weight of the plasma display panel, the chassis base, the holder, and the bracket may be transferred directly to the main body of the conductive member.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
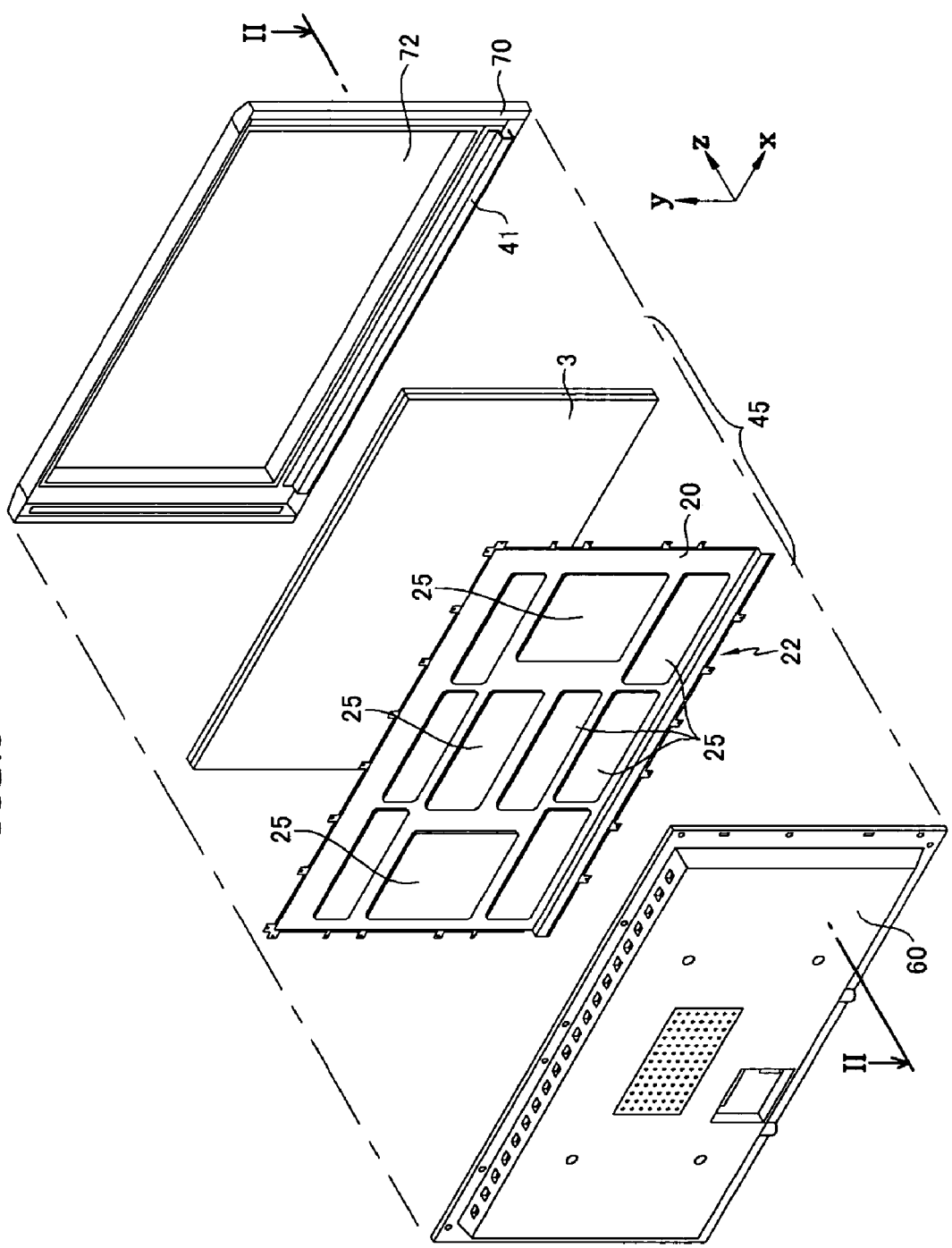
FIG. 1 illustrates an exploded perspective view of a plasma display device according to an embodiment of the present invention.

Korean Patent Application No. 10-2005-0005303, filed on Jan. 20, 2005, in the Korean Intellectual Property Office, and entitled: "Plasma Display Device," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A plasma display device according to the present invention may include a protective layer or film on a front surface of a plasma display panel. Thus, the volume of the plasma display device may be reduced and the weight of the device may be significantly reduced as compared to the conventional art. Further, a plasma display device according to the present invention may not require a space between the front case and the plasma display panel, thus making it possible to reduce or eliminate electromagnetic radiation emitted through any space therebetween. In addition, the protective film, which is constructed so as to remove electromagnetic radiation, may be connected to the chassis base and grounded through a conductive member, allowing for efficient reduction of electromagnetic radiation. Moreover, the plasma display device may include vibration absorbers between the front case and the plasma display panel to protect the plasma display panel from any impact applied to the plasma display panel from the interior or the exterior of the plasma display device.

Figure 2:
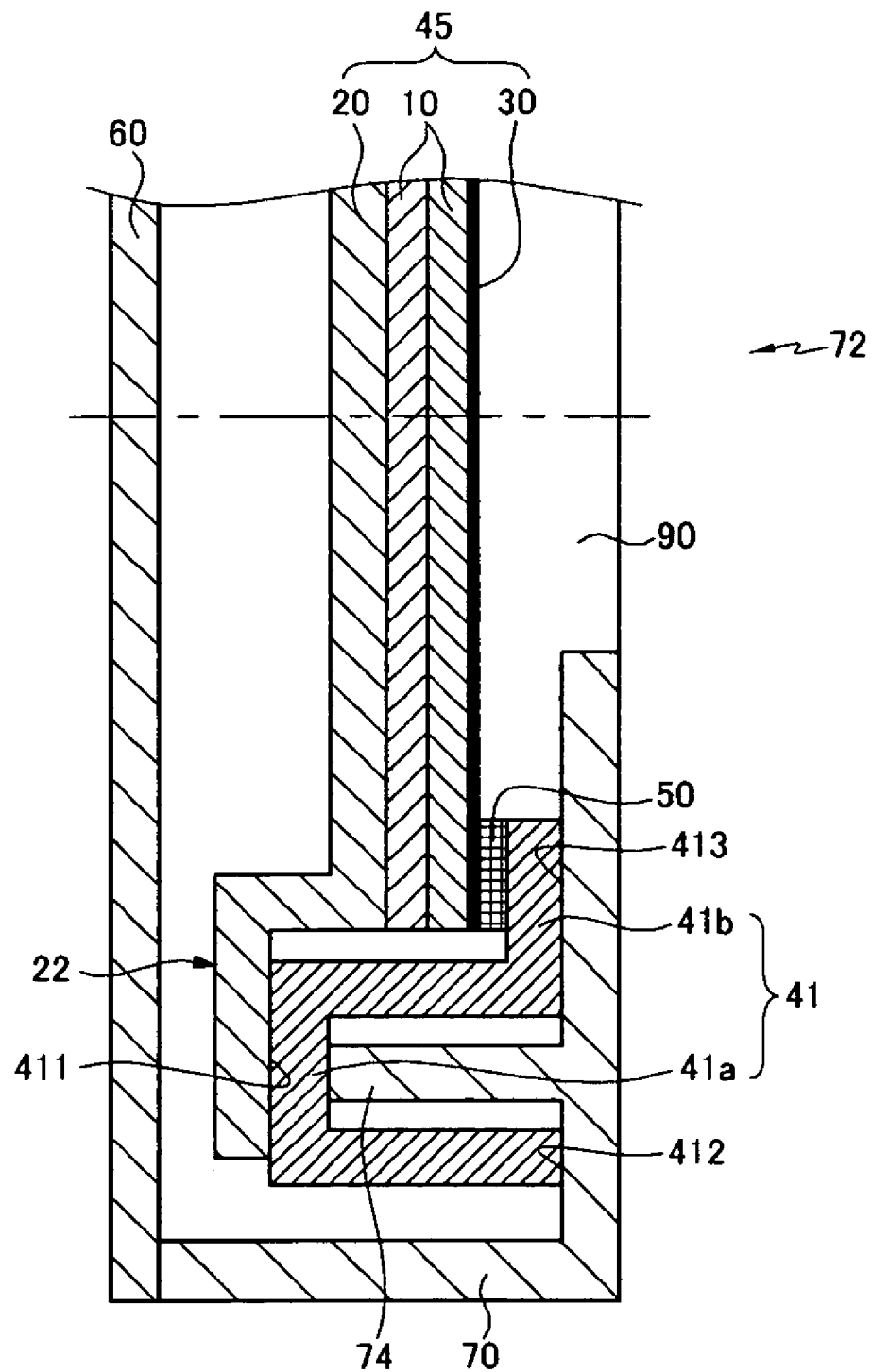
FIG. 2 illustrates a cross-sectional view taken along the line II—II of FIG. 1.

FIG. 1 illustrates an exploded perspective view of a plasma display device according to an embodiment of the present invention, and FIG. 2 illustrates a cross-sectional view taken along the line II—II of FIG. 1.

Referring to FIG. 1, a plasma display device according to an embodiment of the present invention may include a plasma display module 45, which includes a plasma display panel 10, a protective layer 30, a chassis base 20, which may have an offset portion 22, and one or more circuit units 25, which may be disposed on a rear surface of the chassis base 20. The display module may be housed between a front case 70, located at a front surface of the plasma display panel 10, and a rear case 60, which is coupled to the front case 70 and substantially covers the plasma display module 45. A conductive member 41 may be disposed between the plasma display panel 10 and the front case 70. The front case 70 may be formed to cover an outer circumference of the plasma display module 45, and a window 72, through which images are displayed, may provided in the front case 70.

The plasma display panel 10 is a display element that displays images using plasma discharge generated in discharge cells.

The chassis base 20 is formed with a substantially planar shape, and may contact and support the plasma display panel 10, e.g., such that the chassis base 20 is attached to a rear surface of the plasma display panel 10. The chassis base 20 may be made of metal or any other material suitable for supporting the weight of the plasma display panel 10.

The protective layer 30 may be provided on the front surface of the plasma display panel 10. The protective layer 30 may be formed from a thin film, e.g., a polymer containing a reinforcing material, and may be provided over the entire front surface of the plasma display panel 10. Thus, the protective layer 30 may substitute for the conventional reinforced glass. The protective layer 30 may serve to correct optical and physical characteristics of the plasma display panel 10, intercept electromagnetic radiation discharged from the plasma display panel 10 and protect the plasma display panel 10 against impact. The protective layer 30 may be substantially transparent to visible light. In other words, the protective layer 30 may serve as a filter, or a bandpass filter, which blocks electromagnetic radiation but does not substantially block visible light.

The plasma display panel 10, with the protective layer 30 on the front surface, may be attached to the chassis base 20 using, e.g., double-sided adhesive tape. A thermal conductive member may be additionally be provided between the plasma display panel 10 and the chassis base 20 to help diffuse heat generated in the plasma display panel 10.

The circuit units 25 may select the discharge cells of the plasma display panel 10 and apply electrical signals thereto for holding and discharging the selected discharge cells.

The conductive member 41 may be provided on an inner, or rear, surface of the front case 70 and may electrically connect the protective layer 30, located on the front surface of the plasma display panel 10, with the chassis base 20. For example, the conductive member 41 may be disposed along a portion of the front case 70 that covers the circumference of the plasma display panel 10.

In an embodiment, the chassis base 20 may include an offset portion 22 that is stepped at a lower edge of the chassis base 20. The conductive member 41 may be attached to the offset portion 22 of the chassis base 20.

Referring to FIGS. 1 and 2, the conductive member 41 may include a main body 41a, formed so as to be assembled to the offset portion 22 of the chassis base 20, and a leg 41b, extending upward so as to project in front of a portion of the plasma display panel 10. The main body 41a of the conductive member 41 may project toward the offset portion 22 of the chassis base 20, away from the front case 70. The main body may be formed in, e.g., a square "C" shape, as illustrated in FIG. 2, such that the inside of the main body 41a forms an empty cavity. The leg 41b may project upward toward the window 72 from an edge of the main body 41a. A surface 412 of the main body 41a and a surface 413 of the leg 41b, e.g., the right-hand surfaces as illustrated in FIG. 2, may be in contact with an inside surface of the front case 70. The front case 70 may be affixed to the chassis base 20 by a boss 74. A surface of the main body 41a, e.g., a rear surface 411, may be attached, e.g., bonded, to the offset portion 22 of the chassis base 20.

The main body 41a may be disposed along a circumferential portion of the display module 45, e.g., along a lower edge. The leg 41b may be disposed opposite a circumferential portion of the protective layer 30 on the plasma display panel 10, e.g., along a lower edge, such that the leg 41b may be coupled to the protective layer 30. The protective layer 30 on the front surface of the plasma display panel 10, for shielding electromagnetic radiation emitted therefrom, may be connected to the chassis base 20 at the rear surface of the plasma display panel 10 by way of the conductive member 41.

The chassis base 20 and the conductive member 41 may both be made of electrically conductive materials, e.g., metal, and the chassis base 20 may be grounded with the circuit units 25. Thus, electromagnetic radiation may be reduced or eliminated by the protective layer 30.

The conductive member 41 may be directly attached to the protective layer 30, such that their surfaces are in direct contact. Alternatively, a first vibration absorber 50 may be provided between the protective layer 30 and the conductive member 41 so as to absorb impacts and prevent the impacts from being transmitted to the plasma display panel 10.

Figure 4:
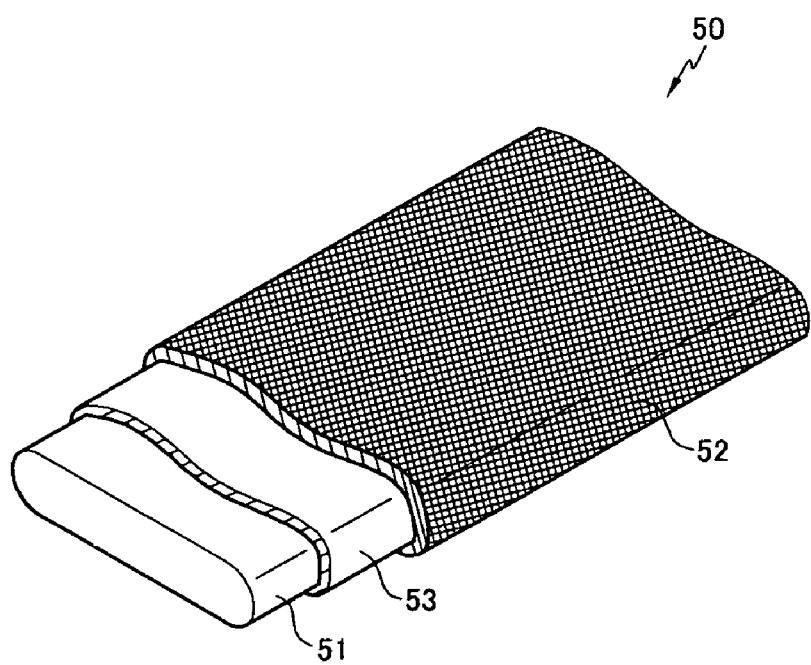
FIG. 4 illustrates a perspective view of a vibration absorber.

Referring to FIG. 4, the first vibration absorber 50 may include an elastically deformable material 51, e.g., a sponge, for absorbing impact, and a conductive layer 52, e.g., a metallic textile fabric, covering the material 51. The conductive layer 52 may be, e.g., a textile fabric formed by weaving a metallic thread.

Since the first vibration absorber 50 may be conductive, the electrical connection between the protective layer 30 and the chassis base 20 may be maintained even though the first vibration absorber 50 is disposed between the protective layer 30 and the conductive member 41. Further, the plasma display panel 10 can be additionally protected from impact. The first vibration absorber 50 may also include a heat shielding member 53, e.g., a fire retardant member, provided between the material 51 and the conductive layer 52, to protect the material 51 from heat.

The plasma display device may further include a second vibration absorber 80 located between the protective layer 30 and the front case 70 to supplement the first vibration absorber 50. The second vibration absorber 80 may not only help absorb impacts on the plasma display panel 10, it may also prevent the foreign material from entering a space between the protective layer 30 and the front case 70. The second vibration absorber 80 may be, e.g., an elastically deformable material such as a sponge having predetermined compressing force.

Figure 3:
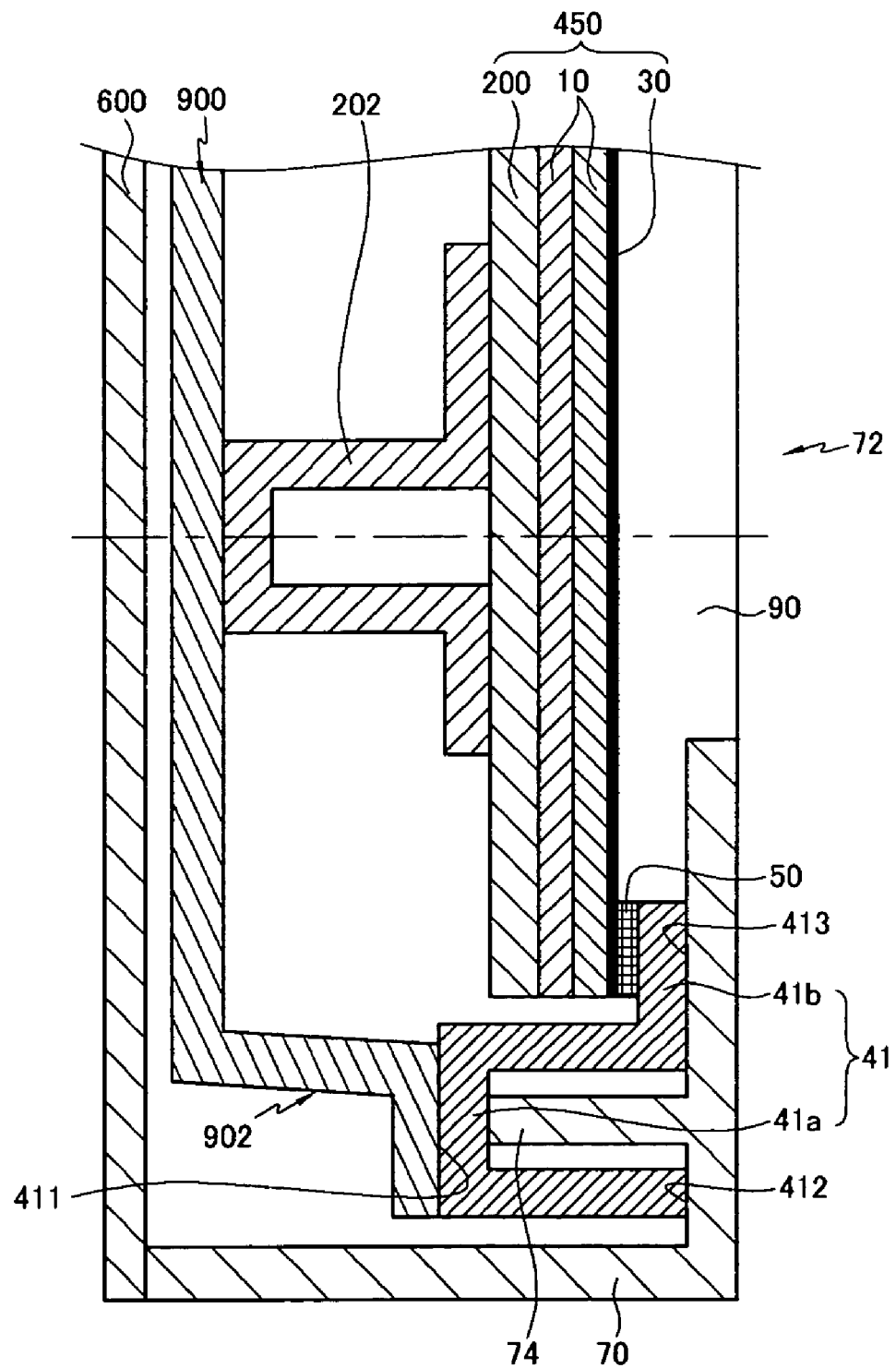
FIG. 3 illustrates a cross-sectional view of a plasma display device according to another embodiment of the present invention.

FIG. 3 illustrates a cross-sectional view of a plasma display device according to another embodiment of the present invention. In the description of this embodiment, components that are substantially the same as those previously described will be denoted by the same reference numerals and a detailed description thereof will not be repeated. Accordingly, the description that follows will focus on the differences therebetween.

The plasma display device according to this embodiment of the invention may include a bracket member 900 provided on a rear surface of a plasma display module 450, which may include a chassis base 200. Implementing the bracket member 900 in this manner may help reduce or eliminate structural deformation of the plasma display module 450. The bracket member 900 may include an offset portion 902 at one end thereof and extending toward the front case 70. The bracket member may be formed of any material suitable for bearing the weight of the display module 450, e.g., metal, and may be conductive.

Additionally, a holder 202 may be provided. The holder 202 may be disposed between a rear surface of the chassis base 200 and a front surface of the bracket 900 to couple the bracket 900 to the chassis base 200. The holder 202 may be formed of any material suitable for bearing the weight of the display module 450, e.g., metal, and may be conductive.

As described above, the conductive member 41 may be provided on a rear, or inner, surface of the front case 70. The conductive member 41 may be disposed adjacent to the offset portion 902 of the bracket 900. The conductive member 41 may be in direct contact with the offset portion 902. The front case 70 may be affixed to the bracket member 900 by a boss 74, and a surface 411 of the conductive member 41 may be attached, e.g., bonded, to the offset portion 902 of the bracket member 900.

The bracket member 900 may be electrically connected to the chassis base 200 via the holder 202, and thus the protective layer 30 on the front surface of the plasma display panel 10 may be electrically connected to the chassis base 200. Accordingly, electromagnetic radiation emitted from the plasma display panel 10 may be reduced or eliminated by the protective layer 30. Further, the bracket member 900 may be made of a conductive material, e.g. metal, and may be grounded to help intercept electromagnetic radiation.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A plasma display device comprising:
   a protective layer disposed adjacent to a front surface of a plasma display panel;
   a chassis base, wherein a front surface of the chassis base is disposed adjacent to a rear surface of the plasma display panel;
   circuit units disposed on a rear surface of the chassis base; and
   a conductive member that electrically connects the protective layer to the chassis base, wherein the protective layer serves to filter electromagnetic radiation emitted from the plasma display panel.

2. The plasma display device as claimed in claim 1, wherein the protective layer is a filter film attached to the front surface of the plasma display panel.

3. The plasma display device as claimed in claim 2, wherein the protective layer is disposed directly on the front surface of the plasma display panel.

4. The plasma display device as claimed in claim 1, wherein the protective layer is a polymer containing a reinforcing material.

5. The plasma display device as claimed in claim 1, further comprising a first vibration absorber disposed between, and in contact with, a front surface of the protective layer and a rear surface of the conductive member, wherein the first vibration absorber is elastically deformable and conductive and electrically connects the protective layer to the conductive member.

6. The plasma display device as claimed in claim 5, further comprising:
   a front case provided on the front of the plasma display panel; and
   a second vibration absorber disposed between, and in contact with, the front surface of the protective layer and a rear surface of the front case.

7. The plasma display device as claimed in claim 1, wherein:
   the chassis base comprises an offset portion at a lower edge, and
   the conductive member is assembled to the offset portion.

8. The plasma display device as claimed in claim 7, wherein:
   the offset portion of the chassis base includes a first member extending rearward from a major surface of the chassis base and a second member extending downward from the first member, such that the second member is substantially parallel to the major surface of the chassis base, and
   a rear surface of the conductive member is assembled to a front surface of the second member.

9. The plasma display device as claimed in claim 7, wherein the conductive member comprises:
   a main body that is assembled to the offset portion of the chassis base; and
   a leg extending upward from the main body in front of a front surface of the protective layer.

10. The plasma display device as claimed in claim 9, further comprising a first vibration absorber provided between the front surface of the protective layer and a rear surface of the leg of the conductive member, wherein the first vibration absorber is elastically deformable and conductive, and electrically connects the protective layer to the conductive member.

11. The plasma display device as claimed in claim 1, further comprising a holder mounted on the rear surface of the chassis base.

12. The plasma display device as claimed in claim 11, further comprising:
   a bracket member attached to the holder.

13. The plasma display device as claimed in claim 12, wherein the bracket member is electrically connected to the chassis base by the holder.

14. The plasma display device as claimed in claim 12, wherein:
   the bracket member has an offset portion at a lower edge, and
   the conductive member contacts the offset portion.

15. The plasma display device as claimed in claim 14, wherein:
   the offset portion of the bracket member includes a first member extending forward from a major surface of the bracket and a second member extending downward from the first member, such that the second member is substantially parallel to the major surface of the bracket, and
   a rear surface of the conductive member is assembled to a front surface of the second member.

16. The plasma display device as claimed in claim 14, wherein the conductive member comprises:
   a main body that is assembled to the offset portion of the bracket member; and
   a leg extending upward from the main body in front of a front surface of the protective layer.

17. The plasma display device as claimed in claim 1, wherein:
   the conductive member comprises a main body and a leg extending upward from the main body, and
   the plasma display panel and the protective layer are supported above the main body such that they do not rest directly on the main body.

18. The plasma display device as claimed in claim 17, wherein a full weight of the plasma display panel is supported by the conductive member.

19. The plasma display device as claimed in claim 18, wherein:
   the full weight of the plasma display panel is transferred directly to the chassis base, and
   the full weight of the plasma display panel and the chassis base is transferred directly to the main body of the conductive member.

20. The plasma display device as claimed in claim 18, wherein:
   the full weight of the plasma display panel is transferred directly to the chassis base,
   the full weight of the plasma display panel and the chassis base is transferred directly to a holder mounted on a rear surface of the chassis base,
   the full weight of the plasma display panel, the chassis base, and the holder is transferred directly to a bracket, and
   the full weight of the plasma display panel, the chassis base, the holder, and the bracket is transferred directly to the main body of the conductive member.

* * * * *